(12) United States Patent
Owens et al.

(10) Patent No.: US 7,254,505 B2
(45) Date of Patent: Aug. 7, 2007

(54) METHOD AND APPARATUS FOR CALIBRATING DELAY LINES

(75) Inventors: Ronnie E. Owens, Fort Collins, CO (US); Theodore G. Rossin, Fort Collins, CO (US); Larry S. Metz, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 48 days.

(21) Appl. No.: 11/170,207

(22) Filed: Jun. 29, 2005

(65) Prior Publication Data

US 2007/0005285 A1 Jan. 4, 2007

(51) Int. Cl.
*H03L 7/06* (2006.01)
(52) U.S. Cl. .................. 702/89; 702/107; 327/158
(58) Field of Classification Search ............ 702/89, 702/107; 323/244; 347/781, 80; 327/146, 327/151–153, 155–158, 160, 161, 164, 262, 327/264, 291, 292
See application file for complete search history.

(56) References Cited

U.S. PATENT DOCUMENTS

| | | | | | |
|---|---|---|---|---|---|
| 4,497,056 A | * | 1/1985 | Sugamori | ............... | 714/736 |
| 4,504,749 A | * | 3/1985 | Yoshida | ............... | 327/276 |
| 5,237,224 A | * | 8/1993 | DeLisle et al. | ............ | 327/276 |
| 5,245,231 A | * | 9/1993 | Kocis et al. | ............... | 327/277 |
| 5,703,515 A | * | 12/1997 | Toyama et al. | ............ | 327/294 |
| 5,712,582 A | | 1/1998 | Yokota et al. | | |
| 6,100,733 A | * | 8/2000 | Dortu et al. | ............... | 327/149 |
| 6,105,157 A | * | 8/2000 | Miller | ................. | 714/744 |
| 6,392,466 B1 | * | 5/2002 | Fletcher | ............... | 327/392 |
| 6,642,760 B1 | * | 11/2003 | Alon et al. | ................. | 327/158 |
| 6,750,688 B2 | * | 6/2004 | Takai | ................. | 327/158 |
| 2004/0091075 A1 | * | 5/2004 | Bhullar et al. | ............ | 375/375 |
| 2005/0024107 A1 | * | 2/2005 | Takai et al. | ................. | 327/158 |

FOREIGN PATENT DOCUMENTS

EP 0671688 A3 8/1998

OTHER PUBLICATIONS

Search Report dated Sep. 22, 2006, for the patent application in Great Britain No. 0612119.8.

* cited by examiner

*Primary Examiner*—Carol S. W. Tsai

(57) ABSTRACT

A delay line (DL) circuit used to generate test pattern waveforms has a pulse generating circuit that is used during calibration to generate a pulse signal upon receiving a signal edge. A delay line of the DL circuit receives the pulse signal and delays the pulse signal by a selected time delay. A feedback loop of the DL circuit feeds the delayed pulse signal output from the delay line back to the input of the pulse generating circuit. Receipt of an edge of the fed back pulse signal at the input of the pulse generating circuit causes the pulse generating circuit to generate another pulse signal. The delayed pulse signal output from the delay line can be input to a counter that generates a counter value that is based on the period of oscillation of the delayed pulse signal.

18 Claims, 2 Drawing Sheets

METHOD AND APPARATUS FOR CALIBRATING DELAY LINES

BACKGROUND OF THE INVENTION

One type of tester for testing integrated circuits (ICs) is an automated test pattern generator (ATPG). A typical ATPG tester generates digital waveform test patterns that are output from input/output (I/O) pins of the tester and input to I/O pins of the IC being tested. A typical ATPG has several application specific integrated circuits (ASICs), each of which contains several delay line (DL) circuits that are used to generate the digital waveforms used to test ICs. Each DL circuit includes a number of delay elements, any subset of which can be switched on to provide a given delay.

A digital waveform is typically created by logically combining the outputs of multiple DL circuits in a formatter (e.g., an Exclusive-OR (XOR) gate) to generate various types of waveforms having various duty cycles. The waveform can be altered by varying the delay settings of one or more of the DL circuits. The output of the formatter is connected to an I/O pin of the ASIC. The signal received at the I/O pin of the ASIC can be steered to an I/O pin of the tester in order to output a test signal from the tester that can be used to test logic inside of an IC.

The signal received at the I/O pin of the ASIC can also be steered to an I/O pin of the tester that is used to calibrate DL circuits contained in the ASIC. Before the ASICs that contain the DL circuits are incorporated into a tester, each DL circuit in each ASIC is calibrated at different delay settings to ensure that the DL circuit is operating properly. The I/O pin of the tester that receives the signal from the ASIC to be calibrated is typically connected to the input of an integrator circuit, which integrates the signal over many duty cycles to produce a high-precision voltage signal that is proportional to the duty cycle of the signal output from the formatter. The high-precision voltage signal is measured by a high-precision voltmeter. The duty cycle is then determined based on the value of the voltage signal.

To calibrate a DL circuit, the output of one DL circuit and the output of another DL circuit are combined by a formatter, and the output of the formatter is steered to one of the aforementioned calibration I/O pins of the tester. The output of one of the DL circuits provides the falling edge of the signal output from the formatter, and the output of the other DL circuit provides the rising edge of the signal output from the formatter. The DL circuit that is not being calibrated has its delay set to a constant delay while the DL circuit that is being calibrated will have its delay setting varied to produce signals having various duty cycles. Thus, the duty cycle of the waveform output from the formatter will vary as the delay setting of the DL circuit being calibrated is varied.

One of the problems associated with the current calibration technique and system is that calibration takes a relatively long time to be performed. A tester may have, for example, 1,000 I/O pins, each of which has an ASIC associated with it. Each ASIC may have, for example, 16 DL circuits. Therefore, a total of 1,000×16=16,000 DL circuits will need to be calibrated. In addition, for each DL circuit, typically many different delay settings will need to be calibrated. With the current calibration technique and system, typically only one of the aforementioned high-precision voltmeters is allocated to each board of the tester. Each board may have, for example, 16 ASICs and one high-precision voltmeter mounted on it. At any given time, the high-precision voltmeter can only measure the voltage signal associated with one of the ASICs on the board. Therefore, multiple DL circuits on the same board cannot be calibrated simultaneously, i.e., in parallel. Consequently, the calibration process is typically very time consuming and may take hours to perform.

Another known system for calibrating a DL circuit involves connecting the delay elements of the DL circuit to form a ring oscillator. The ring oscillator is formed by feeding the output of the last delay element in the delay line back to the input of the first delay element in the delay line. The oscillations in the waveform output from the DL circuit are counted for a fixed period of time. When the delay setting is varied, the number of oscillations that occur during the fixed period of time will vary accordingly. Thus, the change in the amount of delay produced by the DL circuit can be ascertained by counting the difference in the number of oscillations that occur during the fixed period of time when changing from one delay setting to another.

Although the ring oscillator approach enables DL calibration to be performed relatively quickly, the calibration may not be accurate due to the fact that the period of oscillation depends on the average of the rising-edge delay and the falling-edge delay. Because of device mismatching, processing condition variations and other factors, for a given setting, a DL circuit may produce one delay for rising edges and a different delay for falling edges. This creates inaccuracy in the calibration process, which makes it generally unsuitable for its intended purpose.

A need exists for a way to calibrate DL circuits that enables calibration to be performed quickly and with great precision.

SUMMARY OF THE INVENTION

The invention provides a method and an apparatus for calibrating delay lines in an IC. The apparatus comprises a DL circuit having a pulse generating circuit that generates an electrical pulse signal upon receiving an edge of an electrical signal, a delay line that receives the pulse signal output from the pulse generating circuit and delays the pulse signal from arriving at the output of the delay line by a time delay of a duration that depends on selection or deselection of delay elements of the delay line. A feedback loop of the DL circuit feeds the delayed pulse signal output from the delay line back to the input of the pulse generating circuit. Receipt of an edge of the fed back pulse signal at the input of the pulse generating circuit causes the pulse generating circuit to generate a pulse signal. Thus, the feeding back the delayed pulse signal causes the DL circuit to oscillate with a period of oscillation that is measurable, thereby enabling the delay line to be calibrated.

The method and apparatus of the invention are typically incorporated into a tester for testing ICs. The tester includes a plurality of ICs for generating test pattern waveforms. Each IC for generating test pattern waveforms comprises a plurality of DL circuits, each of which comprises a pulse generating circuit that generates an electrical pulse signal upon receiving an edge of an electrical signal, a delay line that receives the generated pulse signal and delays the pulse signal from arriving at the output of the delay line by a time delay of a duration that depends on selection or deselection of delay elements of the delay line, a feedback loop for feeding the delayed pulse signal output from the delay line back to the input of the pulse generating circuit, and a counter that receives the delayed pulse signal output from the delay line and generates a counter value that is based on a period of oscillation of the delayed pulse signal. The tester has a plurality of output pins for outputting test pattern waveforms generated by the ICs of the tester.

The method of the invention comprises generating an electrical pulse signal having a substantially fixed time duration upon receiving an edge of an electrical signal at an input of a pulse generating circuit, outputting the generated pulse signal from an output of the pulse generating circuit, receiving the pulse signal output from the pulse generating circuit at the input of the delay line, delaying the pulse signal from arriving at an output of the delay line by a selected time delay, and feeding the delayed pulse signal output from the delay line back to the input of the pulse generating circuit. Receiving an edge of the fed back pulse signal at the input of the pulse generating circuit causes the pulse generating circuit to generate another pulse signal.

These and other features and advantages of the invention will become apparent from the following description, drawings and claims

DETAILED DESCRIPTION OF AN EMBODIMENT OF THE INVENTION

Figure 1:
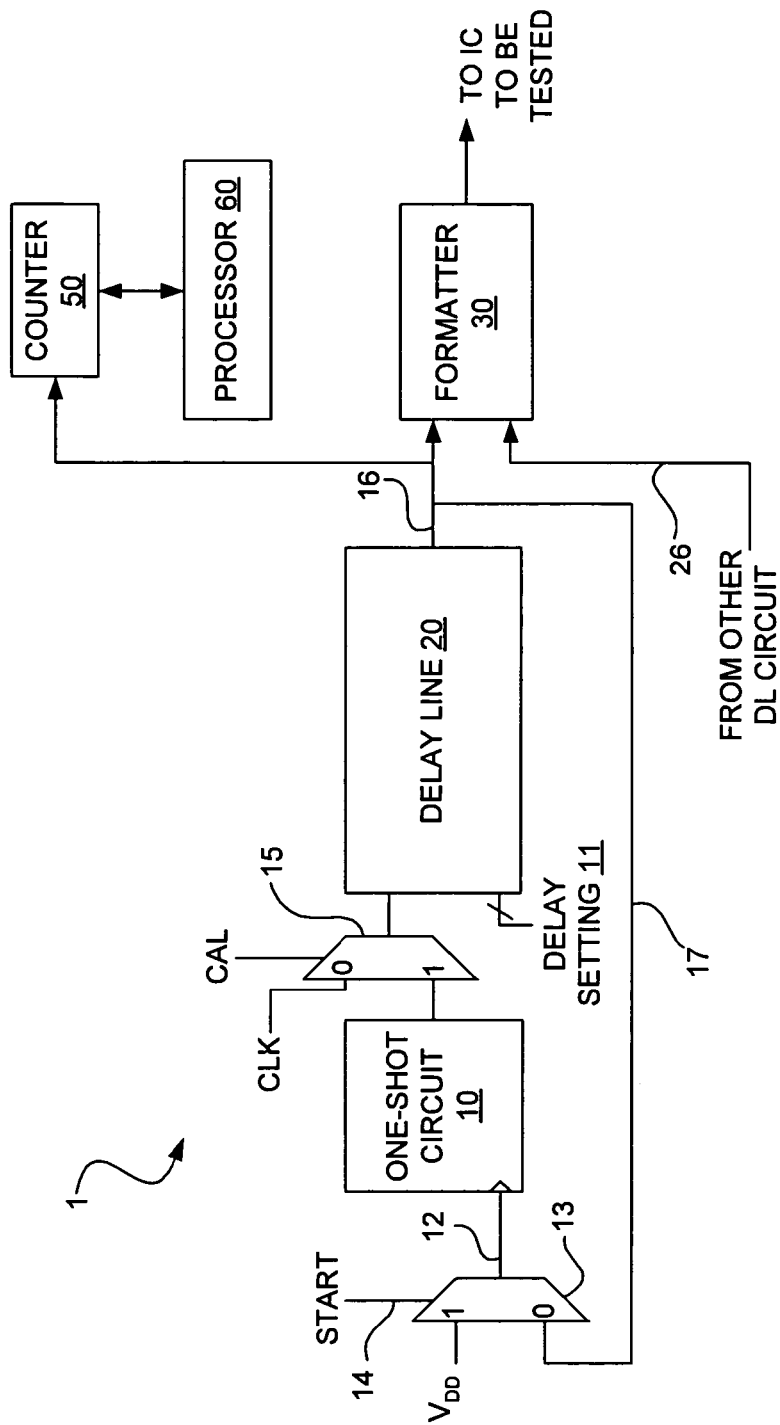
FIG. 1 illustrates a block diagram of the apparatus of the invention in accordance with an embodiment for delay line calibration based on rising edges.

FIG. 1 is a block diagram of the apparatus 1 of the invention in accordance with a first exemplary embodiment for calibrating delay lines. The apparatus 1 is a DL circuit of an IC, such as, for example, an ASIC. Typically, the IC will include several of the DL circuits 1. For example, the IC that contains the DL circuit 1 may contain 16 such circuits. Furthermore, the IC will typically be incorporated into a tester that includes many (e.g., 1,000) such ICs mounted on printed circuit boards (PCBs). For example, each PCB of the tester may have 8 ICs mounted on it and the tester may have a total of 128 PCBs for mounting the ICs. Thus, the total number of DL circuits in the tester may be, for example, (8 ICs per PCB×128 PCBs×16 DL circuits per IC)=16,384 DL circuits.

The invention is not limited with respect to the number of DL circuits per IC or per tester. The quantities given above merely demonstrate the large number of DL circuits that a tester may include and that may need to be calibrated. As described in detail below, the invention enables all of the DL circuits to be calibrated in parallel, i.e., simultaneously. Therefore, the invention enables the amount of time required for calibration to be greatly reduced compared to the amount of time required to perform calibrations using the calibration technique described above (off-chip integrator circuits and high-precision voltmeter to perform calibration serially).

The DL circuit 1 shown in FIG. 1 preferably uses a one-shot circuit 10 to generate a pulse that is input to a variable delay line 20. The variable delay line 20 includes a plurality of delay elements (not shown) that may be switched on and off to place them in and remove them from, respectively, the delay line 20. A multi-bit delay setting 11 selects and deselects delay elements in the delay line 20 in order to place them in and remove them from, respectively, the delay line 20.

The one-shot circuit 10 is triggered by a signal 12 that is output from a multiplexer (MUX) 13. When the "START" signal 14 is asserted, the trigger signal on line 12 will correspond to the supply voltage, VDD. When the "START" signal 14 is deasserted, the trigger signal on line 12 will correspond to the output 16 of the delay line 20. When the one-shot circuit 10 receives the rising edge of the trigger signal, the one-shot circuit 10 generates a pulse that goes high and stays high for a known amount of time. The one-shot circuit 10 is also known as a monostable multivibrator circuit. The one-shot circuit 10 comprises a resistor-capacitor (RC) circuit. The length of time that the pulse generated by the one-shot circuit remains high (i.e., in the a stable state) before transitioning low (i.e., to the stable state) depends on the length of time required to charge the RC circuit to a threshold voltage. Once the RC circuit returns to the stable state, it remains in the stable state (i.e., low) until another trigger signal is received by the one-shot circuit 10.

One of the advantages of using the one-shot circuit 10 is that the duration of the pulse it generates is based on only the rising edge of the trigger signal. Therefore, the aforementioned problem associated with the ring oscillator technique is obviated. As stated above, the ring oscillator generates a signal that has a period of oscillation that depends on the average of the rising-edge delay and the falling-edge delay. For this reason, the ring oscillator technique could not provide accurate calibration of delay lines. Consequently, its use was abandoned. With the one-shot circuit 10 shown in FIG. 1, the timing associated with the occurrence of the falling edge of the trigger signal on line 12 is irrelevant. In other words, the pulse that is generated by the one-shot circuit 10 depends on when the rising edge of the trigger signal is received by the one-shot circuit 10 and on the resistor and capacitor values of the RC circuit inside of the one-shot circuit 10.

During calibration, the selector signal "CAL" of MUX 15 is asserted, which causes the pulse generated by the one-shot circuit 10 to be input to the delay line 20. During the normal mode of operations, the "CAL" signal is deasserted and the clock signal "CLK" is selected and propagates through the delay line 20 to the output 16 of the delay line 20 with a delay that is varied by varying the value of the delay setting signal 11. The length of time that is required for a signal to propagate through the delay line 20 from the input of the first selected delay element in the delay line 20 to the output of the last selected delay element in the delay line 20 depends on the delay line setting 11.

During calibration, the rising edge of the delayed signal output from the output 16 of the delay line 20 propagates along line 17 back through the MUX 13 to the input of the one-shot circuit 10. Receipt of the rising edge of the delayed signal by the one-shot circuit will cause the one-shot circuit 10 to generate the next pulse, which will then propagate through the delay line 20 and back around to the input of the one-shot circuit 10. Therefore, the DL circuit 10 operates as an oscillator having a period of oscillation equal to the time delay provided by the delay line 20 plus the clock-to-Q delay of the one-shot circuit 10, which is a known value that can be calculated based on the resistor and capacitor values of the one-shot circuit 10.

The delay line 20 will typically be calibrated for multiple delay line settings by varying the delay setting 11. An identical DL circuit (not shown) to DL circuit 1 is configured to introduce either no delay or some fixed delay. Line 26 represents the output of the other DL circuit. The output 16 of DL circuit 1 and the output 26 of the DL circuit having the fixed delay or no delay are input to a formatter circuit 30, which logically combines the signals to produce a signal having a particular desired waveform. The formatter circuit 30 may be any type of logic circuit, such as, for example, an XOR gate. The waveform has a particular duty cycle that depends on the amount of delay introduced by delay line 20 of DL circuit 1. The waveform is varied by varying the delay setting 11. The formatted waveform may be output from an output pad of the IC that contains the DL circuit 1 and used as a test waveform for testing circuitry of some other IC (not shown).

The delayed signal 16 output from the DL circuit 1 is also received by a counter 50, which increments when it receives the rising edge of the delayed signal 16. The counter 50 is synchronized to the "START" signal 14. The value of the counter 50 can be retrieved from the counter 50 and converted into the period of oscillation of the delayed signal 16. The manner in which the value in the counter 50 is converted into the period of oscillation of the delayed signal 16 is known.

Typically, each DL circuit on the IC will have its own counter to enable all of the DL circuits to be calibrated simultaneously. The IC may include reporting logic (not shown) that automatically retrieves the counter values and reports them to a processor 60 that converts the counter value into the period of oscillation and determines whether calibration was successful. Thus, in accordance with the invention, no off-chip circuitry or equipment is needed to perform calibration. For example, the aforementioned integration circuit and high-precision voltmeter used with the known DL calibration technique are not needed to perform calibration in accordance with the invention. Because the tester of the invention does not need such equipment, the cost of the tester is greatly reduced compared to the known tester that uses such equipment.

Figure 2:
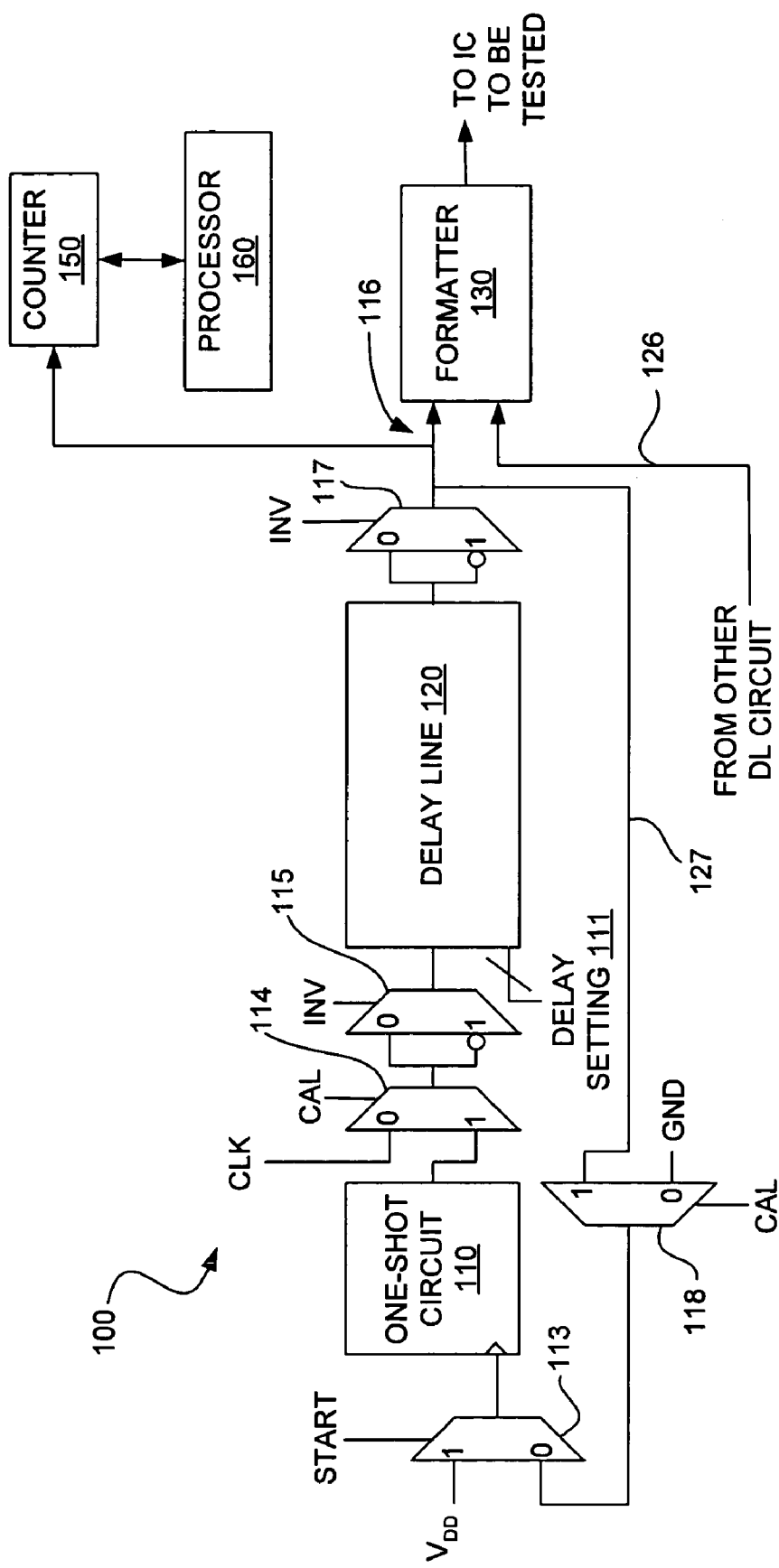
FIG. 2 illustrates a block diagram of the apparatus of the invention in accordance with an embodiment for performing delay line calibration based on either rising edges or falling edges.

FIG. 2 illustrates a block diagram of another exemplary embodiment of the invention. The apparatus in accordance with this embodiment is capable of performing delay line calibration based on either rising edges or falling edges of the delayed signal. Because of the aforementioned problems associated with timing differences between rising-edge delays and falling-edge delays, in prior tester designs, the falling edges of the delayed signals were discarded and only the rising edges were used. In order to accomplish this, the delayed signal output from the delay line was passed through a flip-flop circuit that essentially divides the signal by two, thus throwing away the falling edges.

Recently, a new mode of testing called transition testing has been developed that requires using both the rising and falling edges of the delayed signal in order to generate test waveforms having the desired degree of timing resolution. Testers that do not use both the rising and falling edges of the delayed signal to generate the test waveforms generally are incapable of providing the desired degree of timing resolution. As described below with reference to FIG. 2, the invention enables both the rising and falling edges of the delayed signal to be calibrated, which ensures that the timing intervals selected during testing will be of the proper duration.

FIG. 2 illustrates a block diagram of the DL circuit 100 of the invention that has three modes of operation, namely, a normal mode of operations in which test waveforms are generated and output to an IC being tested, a non-inverting calibration mode in which the rising edges of a signal generated by a one-shot circuit 110 are calibrated, and an inverting calibration mode in which the falling edges of the one-shot circuit 110 are calibrated. The manner in which the DL circuit 100 operates in each of these modes will now be described.

During the normal mode of operations, the CAL, START and INV signals are set to 0. With these signals set to 0, the MUX 114 will select the clock signal CLK, which will be selected by the MUX 115 and input to the delay line 120. This will cause the clock signal CLK to be transmitted to the output 116 of the delay line 120 with a delay that depends on the delay setting 111. The formatter 130 combines the delayed clock signal output from the delay line 120 with a signal on line 126 from another DL circuit (not shown) to generate a test waveform that is output to an IC being tested. With the CAL signal low, the MUX 118 selects ground, GND, which ensures that the input to the one-shot circuit 110 is kept low during the normal mode of operations. Otherwise, the "1" input of MUX 114 might toggle and couple noise into the input of the delay line 120.

When the DL circuit 100 is operating in the non-inverting calibration mode, the INV signal is set to 0 and the CAL signal is set to 1. The INV and CAL signals remain at these levels during the non-inverting calibration mode. The START signal is initially set to 0. The START signal is then set to 1 for a brief interval before being reset to 0. When the START signal is set to 1, the MUX 113 selects VDD, which causes the one-shot circuit 110 to generate a pulse, as described above with reference to FIG. 1. The MUX 114 selects the output of the one-shot circuit 110, which is then selected at the non-inverting input of MUX 115. Therefore, the non-inverted pulse generated by the one-shot circuit 110 will be received as the input to the delay line 120.

The non-inverted pulse propagates down the delay line 120 and is delayed in accordance with the delay setting 111. The MUX 117 then selects the non-inverted, delayed signal at the non-inverted input of MUX 117. The non-inverted, delayed signal output from MUX 117 is fed back on line 127 to an input of MUX 118. The MUX 118 selects the non-inverted, delayed signal, which is then input to MUX 113. MUX 113 selects the non-inverted, delayed signal, which is then input to the one-shot circuit 110, thereby causing the one-shot circuit 110 to generate the next pulse. Thus, the DL circuit 100 will produce an oscillating rising-edge, delayed signal at the output 116 of the delay line 120 that has a period of oscillation that depends on the delay setting 111.

After the START signal is set to 1, it is reset to 0 before the rising edge of the non-inverted, delayed signal arrives at the input of MUX 113 to ensure that the rising edge of the delayed, non-inverted signal that is fed back on line 127 is selected by MUX 113 and input to the one-shot circuit 110. In the non-inverting calibration mode, the period of oscillation of the DL circuit 100 depends on the combined delays of the MUXes 113, 114, 115, 117 and 118, the rising-edge delay provided by the delay line 120 and the clock-to-Q delay of the one-shot circuit 110. The formatter 130 and the counter 150 operate in the same manner described above with reference to the formatter 30 and counter 50, respectively, shown in FIG. 1. The value of the counter 150 is converted into the rising-edge delay of the delay line 120.

When the DL circuit 100 is operating in the inverting calibration mode, the INV signal is set to 1 and the CAL signal is set to 1. The INV and CAL signals remain at these levels during the inverting calibration mode. The START signal is initially set to 0. The START signal is then set to 1 for a brief interval before being reset to 0. When the START signal is set to 1, the MUX 113 selects VDD, which causes the one-shot circuit 110 to generate a pulse, as described above with reference to FIG. 1. The MUX 114 selects the output of the one-shot circuit 110, which is then selected at the inverting input of MUX 115. Therefore, the inverted pulse generated by the one-shot circuit 110 is inverted before being input to the delay line 120.

The inverted pulse propagates down the delay line 120 and is delayed in accordance with the delay setting 111. The MUX 117 then selects the inverted, delayed signal at the inverting input of MUX 117, which re-inverts the inverted, delayed signal. The re-inverted, delayed signal output from MUX 117 is fed back on line 127 to an input of MUX 118. The MUX 118 selects the re-inverted, delayed signal, which is then input to MUX 113. MUX 113 selects the re-inverted, delayed signal, which is then input to the one-shot circuit 110, thereby causing the one-shot circuit 110 to generate the next pulse. Thus, the DL circuit 100 will produce an oscillating falling-edge delayed signal at the output 116 of the delay line 120 that has a period of oscillation that depends on the delay setting 111. At the end of the calibration, the value contained in the counter 150 corresponds to the falling-edge delay of the signal output from the delay line 120. A processor 160 obtains the counter value and converts the counter value into the period of oscillation of the delayed signal.

It should be noted that the functionality of the one-shot circuits shown in FIGS. 1 and 2 could be achieved by using other types of pulse generating circuits. The pulse generating circuit that is used for this purpose should have the capability of generating a pulse upon receiving an edge of a trigger signal, and the generated pulse should have a width that is independent of when the other edge of the trigger signal occurs. The one-shot circuit is an example of one circuit that has this capability. Those skilled in the art will understand, in view of the description provided herein, the manner in which other pulse generating circuits can be configured that are suitable for use in the DL circuit of the invention.

It should be noted that the invention has been described with reference to a few exemplary embodiments and that the invention is not limited to these embodiments. The embodiments described above with reference to FIGS. 1 and 2 have particular circuitry that may be varied while still achieving the objectives of the invention. For example, the MUXes shown in FIGS. 1 and 2 perform certain selection tasks that are capable of being performed by other types of logical configurations. In addition, the invention is not limited to any particular types of logical configurations for performing the tasks described above with reference to FIGS. 1 and 2, such as signal inversion, for example. Those skilled in the art will understand, in view of the description provided herein, that these and other modifications can be made to the embodiments described above and that all such modifications are within the scope of the invention.

What is claimed is:

1. An apparatus for calibrating delay lines in an integrated circuit (IC), the apparatus comprising:
   a pulse generating circuit having an input and an output, the pulse generating circuit generating an electrical pulse signal upon receiving an edge of an electrical signal, the pulse signal having a substantially fixed time duration;
   a delay line having an input and an output, the delay line comprising a plurality of delay elements and delay element selection logic, the delay line receiving at the input of the delay line a pulse signal output from the pulse generating circuit and delaying the pulse signal from arriving at the output of the delay line by a time delay of a duration that depends on selection or deselection of delay elements by the delay element selection logic; and
   a feedback loop for feeding the delayed pulse signal output from the delay line back to the input of the pulse generating circuit, wherein receiving an edge of the fed back pulse signal at the input of the pulse generating circuit causes the pulse generating circuit to generate a pulse signal.

2. The apparatus of claim 1, wherein the pulse generating circuit generates the electrical pulse signal upon receiving a rising edge of an electrical signal.

3. The apparatus of claim 1, wherein the pulse generating circuit generates the electrical pulse signal upon receiving a falling edge of an electrical signal.

4. The apparatus of claim 1, further comprising:
   first inversion logic for inverting the pulse signal output from the pulse generating circuit; and
   second inversion logic for inverting the delayed pulse signal output from the delay line.

5. The apparatus of claim 1, wherein the pulse generating circuit is a monostable multivibrator circuit.

6. The apparatus of claim 1, further comprising:
   a counter that receives the delayed pulse signal output from the delay line and generates a counter value that is based on a period of oscillation of the delayed pulse signal.

7. A tester for testing integrated circuits (ICs), the tester comprising:
   a plurality of ICs for generating test pattern waveforms, each IC for generating test pattern waveforms comprising a plurality of delay line (DL) circuits, each DL circuit comprising
      a pulse generating circuit having an input and an output, the pulse generating circuit generating an electrical pulse signal upon receiving an edge of an electrical signal, the pulse signal having a substantially fixed time duration,
      a delay line having an input and an output, the delay line comprising a plurality of delay elements and delay element selection logic, the delay line receiving at the input of the delay line a pulse signal output from the pulse generating circuit and delaying the pulse signal from arriving at the output of the delay line by a time delay of a duration that depends on selection or deselection of delay elements by the delay element selection logic,
      a feedback loop for feeding the delayed pulse signal output from the delay line back to the input of the pulse generating circuit, wherein receiving an edge of the fed back pulse signal at the input of the pulse generating circuit causes the pulse generating circuit to generate a pulse signal, and
      a counter that receives the delayed pulse signal output from the delay line and generates a counter value that is based on a period of oscillation of the delayed pulse signal; and
   a plurality of output pins for outputting test pattern waveforms generated by the ICs.

8. The tester of claim 7, wherein each IC for generating test pattern waveforms further comprises:
   at least one processor that reads the counter value from the counter and processes the counter value to convert the counter value into the period of oscillation of the delayed pulse signal.

9. The tester of claim 7, wherein the pulse generating circuit generates the electrical pulse signal upon receiving a rising edge of an electrical signal.

10. The tester of claim 7, wherein the pulse generating circuit generates the electrical pulse signal upon receiving a falling edge of an electrical signal.

11. The tester of claim 7, wherein each DL circuit further comprising:
   first inversion logic for inverting the pulse signal output from the pulse generating circuit; and
   second inversion logic for inverting the delayed pulse signal output from the delay line.

12. The tester of claim 7, wherein the pulse generating circuit is a monostable multivibrator circuit.

13. A method for calibrating delay lines in an integrated circuit (IC), the method comprising:
   in a pulse generating circuit, generating an electrical pulse signal having a substantially fixed time duration, the pulse generating circuit generating the pulse upon receiving an edge of an electrical signal at an input of the pulse generating circuit;
   outputting the generated pulse signal from an output of the pulse generating circuit;
   receiving at the input of the delay line the pulse signal output from the pulse generating circuit;
   delaying the pulse signal from arriving at an output of the delay line by a selected time delay; and
   feeding the delayed pulse signal output from the delay line back to the input of the pulse generating circuit, wherein receiving an edge of the fed back pulse signal at the input of the pulse generating circuit causes the pulse generating circuit to generate another pulse signal.

14. The method of claim 13, wherein the pulse generating circuit generates the electrical pulse signal upon receiving a rising edge of an electrical signal.

15. The method of claim 13, wherein the pulse generating circuit generates the electrical pulse signal upon receiving a falling edge of an electrical signal.

16. The method of claim 13, further comprising:
   before the pulse signal is received at the input of the delay line, inverting the pulse signal output from the pulse generating circuit; and
   after the delayed pulse signal is output from the delay line and before the pulse signal is fed back to the input of the pulse generating circuit, inverting the delayed pulse signal output from the delay line.

17. The method of claim 13, further comprising:
   inputting the signal that is fed back to the input of the pulse generating circuit to a counter that generates a count based on a period of oscillation of the delayed pulse signal.

18. The method of claim 13, further comprising:
   processing the counter value to convert the counter value into the period of oscillation of the delayed pulse signal.

* * * * *